United States Patent
Rose et al.

(10) Patent No.: US 9,553,229 B2
(45) Date of Patent: *Jan. 24, 2017

(54) ETCHING OF SOLAR CELL MATERIALS

(75) Inventors: Douglas H. Rose, San Jose, CA (US); Pongsthorn Uralwong, Campbell, CA (US); David D. Smith, Campbell, CA (US)

(73) Assignee: SunPower Corporation, San Jose, CA (US)

( * ) Notice: Subject to any disclaimer, the term of this patent is extended or adjusted under 35 U.S.C. 154(b) by 892 days.

This patent is subject to a terminal disclaimer.

(21) Appl. No.: 13/220,974

(22) Filed: Aug. 30, 2011

(65) Prior Publication Data

US 2011/0312119 A1    Dec. 22, 2011

Related U.S. Application Data

(60) Continuation of application No. 12/251,296, filed on Oct. 14, 2008, now Pat. No. 8,029,683, which is a division of application No. 10/632,747, filed on Aug. 1, 2003, now Pat. No. 7,455,787.

(51) Int. Cl.
*H01L 31/18* (2006.01)
(52) U.S. Cl.
CPC ..................................... *H01L 31/18* (2013.01)
(58) Field of Classification Search
CPC ........................................................ H01L 31/18
USPC ...................... 438/57; 257/E27.123–E27.126
See application file for complete search history.

(56) References Cited

U.S. PATENT DOCUMENTS

| | | | |
|---|---|---|---|
| 4,378,270 A * | 3/1983 | Brasch | 216/93 |
| 6,787,692 B2 * | 9/2004 | Wada et al. | 136/256 |
| 2002/0025599 A1 * | 2/2002 | Ho et al. | 438/106 |
| 2007/0241460 A1 * | 10/2007 | Mis et al. | 257/764 |

\* cited by examiner

*Primary Examiner* — Troy Tran
(74) *Attorney, Agent, or Firm* — Okamoto & Benedicto LLP

(57) ABSTRACT

A solar cell is fabricated by etching one or more of its layers without substantially etching another layer of the solar cell. In one embodiment, a copper layer in the solar cell is etched without substantially etching a topmost metallic layer comprising tin. For example, an etchant comprising sulfuric acid and hydrogen peroxide may be employed to etch the copper layer selective to the tin layer. A particular example of the aforementioned etchant is a Co-Bra Etch® etchant modified to comprise about 1% by volume of sulfuric acid, about 4% by volume of phosphoric acid, and about 2% by volume of stabilized hydrogen peroxide. In one embodiment, an aluminum layer in the solar cell is etched without substantially etching the tin layer. For example, an etchant comprising potassium hydroxide may be employed to etch the aluminum layer without substantially etching the tin layer.

20 Claims, 3 Drawing Sheets

ETCHING OF SOLAR CELL MATERIALS

CROSS-REFERENCE TO RELATED APPLICATIONS

This application is a continuation of U.S. application Ser. No. 12/251,296, filed on Oct. 14, 2008, which is a divisional of U.S. application Ser. No. 10/632,747, filed on Aug. 1, 2003, now U.S. Pat. No. 7,455,787. The just mentioned disclosures are incorporated herein by reference in their entirety.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. They may be fabricated on a semiconductor wafer using semiconductor processing technology. Generally speaking, a solar cell may be fabricated by forming p-doped and n-doped regions in a silicon substrate. Solar radiation impinging on the solar cell creates electrons and holes that migrate to the p-doped and n-doped regions, thereby creating voltage differentials between the doped regions. The side of the solar cell where connections to an external electrical circuit are made includes a topmost metallic surface that is electrically coupled to the doped regions. There may be several layers of materials between the metallic surface and the doped regions. These materials may be patterned and etched to form internal structures. It is important to etch these materials in a way that would not compromise the operability and performance of the solar cell.

SUMMARY

A solar cell is fabricated by etching one or more of its layers without substantially etching another layer of the solar cell. In one embodiment, a copper layer in the solar cell is etched without substantially etching a topmost metallic layer comprising tin. For example, an etchant comprising sulfuric acid and hydrogen peroxide may be employed to etch the copper layer selective to the tin layer. A particular example of the aforementioned etchant is a Co-Bra Etch® etchant modified to comprise about 1% by volume of sulfuric acid, about 4% by volume of phosphoric acid, and about 2% by volume of stabilized hydrogen peroxide. In one embodiment, an aluminum layer in the solar cell is etched without substantially etching the tin layer. For example, an etchant comprising potassium hydroxide may be employed to etch the aluminum layer without substantially etching the tin layer.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided such as examples of process parameters, materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

FIGS. 1-4 show sectional views schematically illustrating the fabrication of a solar cell in accordance with an embodiment of the present invention. FIGS. 1-4, which are not drawn to scale, show the solar cell in the middle of the fabrication process. Masking steps are not shown or described in the interest of clarity.

Figure 1:
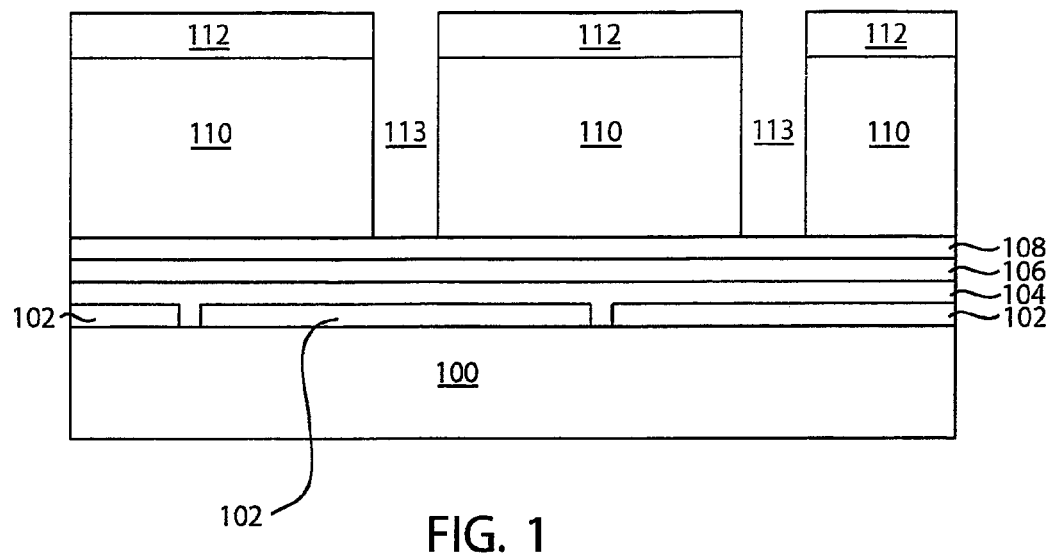
FIGS. 1-4 show sectional views schematically illustrating the fabrication of a solar cell in accordance with an embodiment of the present invention.

In FIG. 1, the solar cell is shown as having a tin (Sn) layer 112, a copper (Cu) layer 110, a copper layer 108, a titanium-tungsten (TiW) layer 106, an aluminum (Al) layer 104, a silicon dioxide ($SiO_2$) layer 102, and a silicon (Si) substrate 100. Tin layer 112 is on the backside of the solar cell, while silicon substrate 100 is towards the front or sun side. The solar cell being fabricated is a so-called "backside-contact solar cell" in that all electrical connections to the doped regions (not shown) in silicon substrate 100 are made from the backside of the solar cell by way of tin layer 112. However, it is to be noted that the present invention is not limited to backside-contact solar cells. The teachings of the present disclosure may be employed in the fabrication of solar cells in general.

In the example of FIG. 1, tin layer 112 is the topmost metallic layer and provides a solderable metallic surface on which electrical connections may be made. For example, interconnect leads coupled to an external electrical circuit or other solar cells may be soldered on tin layer 112. Tin layer 112 also protects underlying layers of materials. For example, tin layer 112 helps prevent copper layer 110 from corroding. In one embodiment, tin layer 112 is electroplated to a thickness of about 5 microns on copper layer 110.

Copper layer 110, copper layer 108, titanium-tungsten layer 106, and aluminum layer 104 form a Cu/TiW/Al metal stack that provides electrical connectivity to doped regions in silicon substrate 100. In one embodiment, copper layer 110 is electroplated to a thickness of about 20 microns on copper layer 108. Masks (not shown) may be formed between individual structures of copper layer 110 in gaps 113 before the electroplating process. The masks are removed after the electroplating process to obtain the structure shown in FIG. 1.

Copper layer 108 serves as a seed layer for the electroplating of copper layer 110. Copper layer 108 may be formed to a thickness of about 1600 Angstroms by sputtering. Titanium-tungsten layer 106 and aluminum layer 104 may also be formed by sputtering. In one embodiment, titanium-tungsten layer 106 and aluminum layer 104 are each formed to a thickness of about 1000 Angstroms. Aluminum layer 104 may comprise aluminum with 1% silicon alloy.

Silicon dioxide layer 102 serves as a dielectric layer providing electrical isolation between the overlying Cu/TiW/Al metal stack and silicon substrate 100. Vias are formed through silicon dioxide layer 102 in sections where the Cu/TiW/Al metal stack makes contact with the doped regions in silicon substrate 100. In one embodiment, silicon dioxide layer 102 is formed to a thickness of about 950 Angstroms.

There may be steps in the fabrication of a solar cell where an etch is performed through a stack of materials comprising copper, titanium-tungsten, and aluminum. To prevent damaging the solar cell, each layer in the material stack may need to be etched without attacking (i.e., excessively etching) other layers of the solar cell. In the example of FIG. 1, copper layer 108, titanium-tungsten layer 106, and aluminum layer 104 need to be etched without attacking tin layer 112. Excessive etching of tin layer 112 may compromise its ability to protect the underlying metal stack.

One way of etching through copper layer 108, titanium-tungsten layer 106, and aluminum layer 104 is to use a so-called "PAWN" (phosphoric, acetic, water, nitric) solution to etch copper layer 108 and aluminum layer 104. For example, the sample of FIG. 1 may be wet etched in a PAWN bath to etch copper layer 108, in a hydrogen peroxide bath to etch titanium-tungsten layer 106, and in a PAWN bath to etch aluminum layer 104. PAWN is commonly used to etch aluminum in the electronics industry, which does not require selectivity to copper, tin, and other materials employed in solar cells. The inventors found that PAWN has a tendency to attack tin layer 112 during the etching of copper layer 108 and aluminum layer 104. The present disclosure provides improved techniques for etching a copper layer, a titanium-tungsten layer, and/or aluminum layer without substantially etching a tin layer in a solar cell or similar device. The techniques may be employed to etch several layers of a material stack or a single layer.

Figure 2:
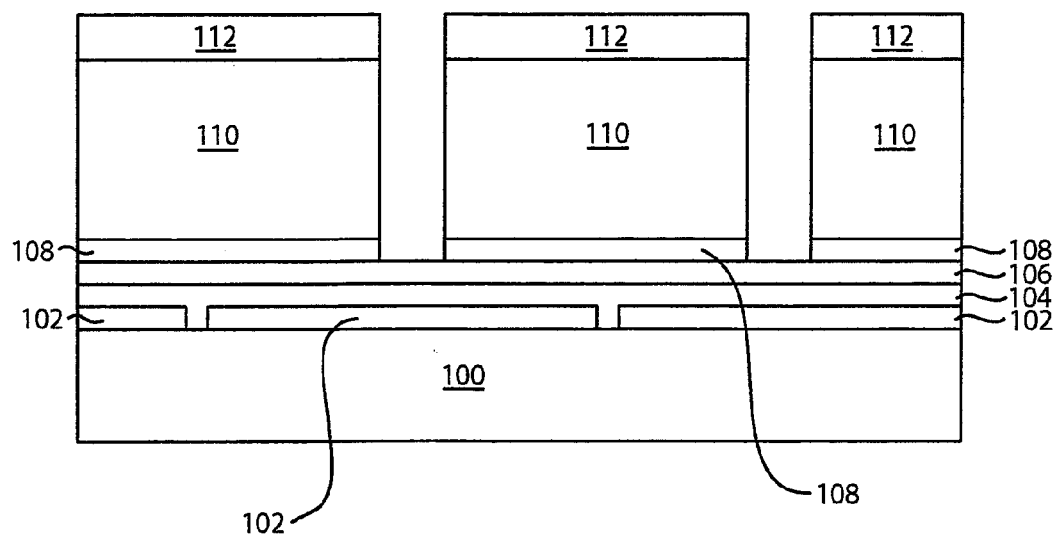

Continuing in FIG. 2, copper layer 108 is etched selective to tin layer 112 and titanium-tungsten layer 106. Copper layer 108 may be wet etched in a solution comprising sulfuric acid and hydrogen peroxide. For example, copper layer 108 may be wet etched using a Co-Bra Etch® etchant modified to comprise about 1% by volume of sulfuric acid, about 4% by volume of phosphoric acid, and about 2% by volume of stabilized hydrogen peroxide. A Perma-Etch® etchant may also be employed to etch copper layer 108. Co-Bra Etch® and Perma-Etch® etchants are both commercially available from Electrochemicals, Inc. of Maple Plain, Minn. In one experiment, a sample similar to that shown in FIG. 1 was dipped in a bath of the aforementioned modified Co-Bra Etch® etchant for about 1 minute at 40° C. About 1600 Angstroms of copper layer 108 were removed without excessively etching tin layer 112 or titanium-tungsten layer 106.

Figure 3:
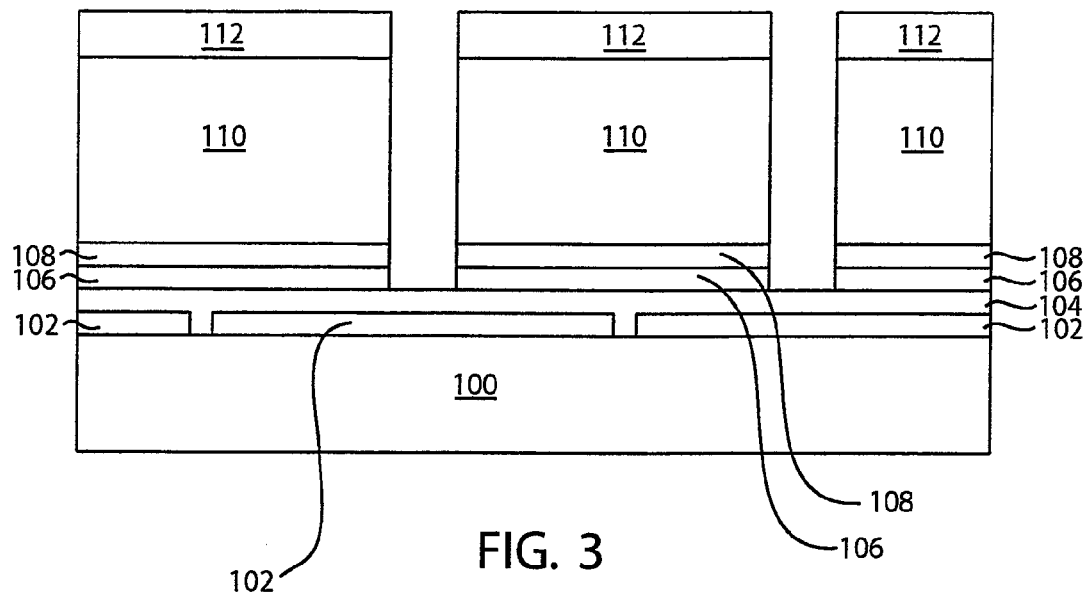

In FIG. 3, titanium-tungsten layer 106 is etched selective to tin layer 112, copper layers 110 and 108, and aluminum layer 104. Titanium-tungsten layer 106 may be wet etched in a bath of hydrogen peroxide, for example. The hydrogen peroxide may be 30% by weight (balance is water).

Figure 4:
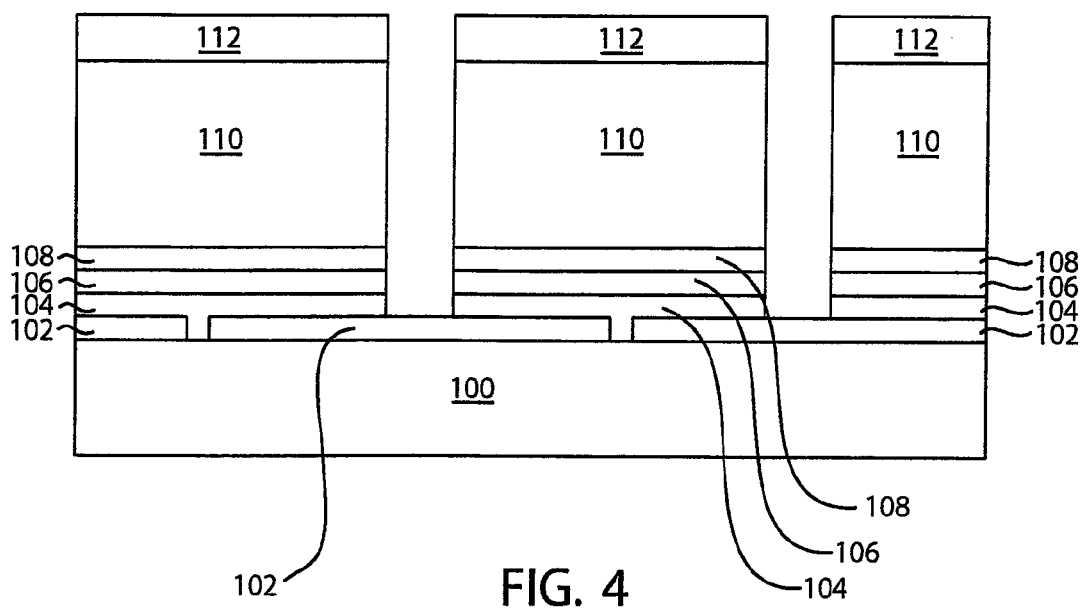

In FIG. 4, aluminum layer 104 is etched selective to tin layer 112, copper layers 110 and 108, titanium-tungsten layer 106, and silicon dioxide layer 102. Aluminum layer 104 may be wet etched in a bath of potassium hydroxide. In one embodiment, aluminum layer 104 is wet etched using an etchant comprising about 1% by volume of potassium hydroxide in water. Other concentrations of potassium hydroxide may also be employed depending on the application. In one experiment, a sample similar to that shown in FIG. 3 was dipped in a bath comprising about 1% by volume of potassium hydroxide in water for about 1.5 minutes at 40° C. About 1000 Angstroms of aluminum layer 104 were removed without excessively etching tin layer 112, copper layers 110 and 108, titanium-tungsten layer 106, and silicon dioxide layer 102.

The teachings of the present disclosure may be generally employed to etch one or more layers of materials in a solar cell being fabricated. For example, the etching techniques disclosed herein may be employed in the fabrication of solar cells disclosed in the following commonly-assigned disclosures, which are incorporated herein by reference in their entirety: U.S. application Ser. No. 10/412,638, entitled "Improved Solar Cell and Method of Manufacture," filed on Apr. 10, 2003 by William P. Mulligan, Michael J. Cudzinovic, Thomas Pass, David Smith, Neil Kaminar, Keith McIntosh, and Richard M. Swanson; and U.S. application Ser. No. 10/412,711, entitled "Metal Contact Structure For Solar Cell And Method Of Manufacture," filed on Apr. 10, 2003 by William P. Mulligan, Michael J. Cudzinovic, Thomas Pass, David Smith, and Richard M. Swanson. It is to be noted, however, that the aforementioned disclosures are referenced herein only as examples.

The etch chemistries provided herein not only allow selectivity to materials found in solar cells, but also have relatively high etch capacity, are cost-effective, and are easily replenished and controlled. Embodiments of the present invention may thus be advantageously employed to etch a single layer of material or a stack of materials in solar cell fabrication processes in general.

Figure 5:
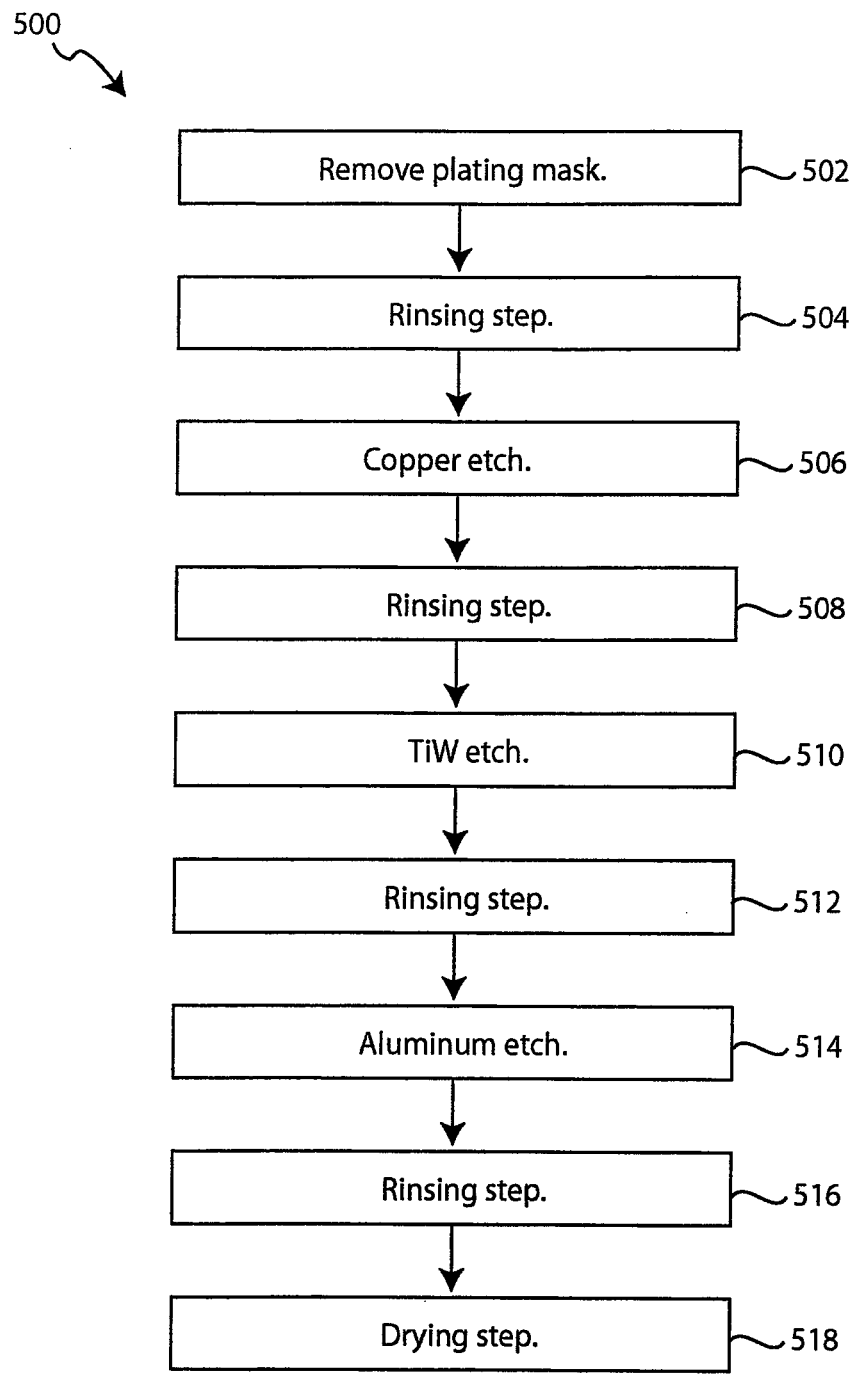
FIG. 5 shows a flow diagram of a method of etching one or more materials in a solar cell in accordance with an embodiment of the present invention.

Referring now to FIG. 5, there is shown a flow diagram of a method 500 of etching one or more materials in a solar cell in accordance with an embodiment of the present invention. Among its other uses, method 500 may be employed to etch through a material stack comprising copper, titanium-tungsten, and aluminum in a solar cell. Method 500 will be described using FIGS. 1-4 as an example.

In step 502 and with reference to FIG. 1, a plating mask, if any, that may have been employed in the electroplating of copper layer 110 is removed. Step 502 may be performed by placing the sample of FIG. 1 in about 2% to 3% potassium hydroxide bath at 40° C. for about 5 minutes.

In step 504, the sample of FIG. 1 is rinsed. For example, the sample of FIG. 1 may be placed in a bath of deionized water, spray-rinsed with deionized water, and then dumped-rinsed in deionized water.

In step 506, copper layer 108 is etched as shown in FIG. 2. Step 506 may be performed by placing the sample of FIG. 1 in a bath of a Co-Bra Etch® etchant modified to comprise about 1% by volume of sulfuric acid, about 4% by volume of phosphoric acid, and about 2% by volume of stabilized hydrogen peroxide at 43° C. with robotic agitation for about 2 minutes and 10 seconds.

In step 508, the sample of FIG. 2 is rinsed. Step 508 may be performed by dump-rinsing the sample of FIG. 2 in deionized water.

In step 510, titanium-tungsten layer 106 is etched as shown in FIG. 3. Step 510 may be performed by placing the sample of FIG. 3 in a bath of about 30% by weight hydrogen peroxide at 40° C. with robotic agitation for about 2 minutes and 15 seconds.

In step 512, the sample of FIG. 3 is rinsed. Step 512 may be performed by dump-rinsing the sample of FIG. 3 in deionized water.

In step 514, aluminum layer 104 is etched as shown in FIG. 4. Step 514 may be performed by placing the sample of FIG. 3 in a bath of about 1% by volume potassium hydroxide at 40° C. for about 2 minutes and 15 seconds.

In step 516, the sample of FIG. 4 is rinsed. Step 516 may be performed by dump-rinsing the sample of FIG. 4 in deionized water.

In step 518, the sample of FIG. 4 is dried. Step 518 may be performed by spin-rinse drying. Air-knife and meniscus drying techniques may also be employed to dry the sample of FIG. 4.

While specific embodiments of the present invention have been provided, it is to be understood that these embodiments are for illustration purposes and not limiting. For example, the above described etchants may also be applied using in-line drag-through and in-line spray systems. Many additional embodiments will be apparent to persons of ordinary skill in the art reading this disclosure.

What is claimed is:

1. A method of fabricating a solar cell, the method comprising:
   etching a first layer comprising copper selective to a topmost metallic layer comprising tin of the solar cell, the topmost metallic layer providing a solderable metallic surface for electrically coupling the solar cell to an external electrical circuit.

2. The method of claim 1 wherein the first layer is etched using an etchant comprising sulfuric acid and hydrogen peroxide.

3. The method of claim 1 wherein the first layer is etched using an etchant comprising about 1% by volume of sulfuric acid, about 4% by volume of phosphoric acid, and about 2% by volume of stabilized hydrogen peroxide.

4. The method of claim 1 wherein the first layer and the topmost metallic layer are on the backside of the solar cell, the backside being opposite a front side facing the sun during normal operation.

5. The method of claim 1 further comprising:
   etching a second layer comprising titanium-tungsten using an etchant comprising hydrogen peroxide.

6. The method of claim 5 further comprising:
   etching a third layer comprising aluminum using an etchant comprising potassium hydroxide.

7. The method of claim 1 further comprising:
   etching a second layer comprising aluminum using an etchant comprising potassium hydroxide.

8. The method of claim 7 wherein the etchant comprises about 1% by volume of potassium hydroxide in water.

9. The method of claim 1 wherein the topmost metallic layer protects a second layer under the topmost metallic layer during the etching of the first layer.

10. The method of claim 9 wherein the second layer comprises copper.

11. A method of etching a layer of material of a solar cell, the method comprising:
    etching a first copper layer selective to a tin layer of the solar cell, the tin layer being a topmost metallic layer and configured to provide a solderable metallic surface and to protect a second copper layer between the tin layer and the first copper layer during the etching of the first copper layer.

12. The method of claim 11 wherein the first copper layer is etched using an etchant comprising about 1% by volume of sulfuric acid, about 4% by volume of phosphoric acid, and about 2% by volume of stabilized hydrogen peroxide.

13. The method of claim 11 wherein the first copper layer is etched using an etchant comprising hydrogen peroxide and sulfuric acid.

14. The method of claim 11 further comprising etching a layer of aluminum using an etchant comprising about 1% by volume of potassium hydroxide in water.

15. The method of claim 11 wherein the first copper layer, the second copper layer, and the tin layer are on a backside of the solar cell, the backside being opposite a front side facing the sun during normal operation.

16. A method of fabricating a solar cell, the method comprising:
    etching a layer of copper selective to a layer of tin of the solar cell, the layer of tin being a topmost metallic layer of the solar cell and providing a solderable metallic surface for electrically coupling the solar cell to an external electrical circuit.

17. The method of claim 16 wherein the layer of copper is etched using an etchant comprising sulfuric acid and hydrogen peroxide.

18. The method of claim 16 wherein the layer of copper is etched using an etchant comprising about 1% by volume of sulfuric acid, about 4% by volume of phosphoric acid, and about 2% by volume of stabilized hydrogen peroxide.

19. The method of claim 16 wherein the layer of copper and the layer of tin are on a backside of the solar cell, the backside being opposite a front side facing the sun during normal operation.

20. The method of claim 16 wherein the layer of tin protects another layer of copper under the tin layer during etching.

* * * * *